United States Patent [19]
Volk

[11] Patent Number: 5,332,930
[45] Date of Patent: Jul. 26, 1994

[54] PHASE LOCKED LOOP CIRCUITRY WITH VARIABLE GAIN AND BANDWIDTH

[75] Inventor: Andrew M. Volk, Loomis, Calif.
[73] Assignee: Intel Corporation, Santa Clara, Calif.
[21] Appl. No.: 82,280
[22] Filed: Jun. 24, 1993
[51] Int. Cl.$^5$ .......................... H03L 7/16; H03L 7/08
[52] U.S. Cl. ................................. 307/270; 307/264; 307/268; 328/155
[58] Field of Search ............... 307/264, 268, 270, 571, 307/584; 328/155

[56] References Cited

U.S. PATENT DOCUMENTS

| | | | |
|---|---|---|---|
| 4,316,150 | 2/1982 | Crosby | 328/133 |
| 4,668,918 | 5/1987 | Adams | 328/155 |
| 4,686,481 | 8/1987 | Adams | 328/133 |
| 4,819,081 | 4/1989 | Volk et al. | 328/134 |
| 4,829,258 | 5/1989 | Volk et al. | 328/155 |

Primary Examiner—William L. Sikes
Assistant Examiner—Tiep Nguyen
Attorney, Agent, or Firm—Blakely, Sokoloff, Taylor & Zafman

[57] ABSTRACT

An adjustable current source circuit of a phase locked loop (PLL) circuitry fabricated on a single substrate provides a first current that is a function of an error voltage proportional to an amount of a phase difference of a comparison of a reference signal and a feedback signal. The circuit includes a first current source coupled to receive a second current from a reference phase locked loop of the PLL circuitry for providing a first portion of the first current under control of the second current. The first portion of the first current is proportional to the second current. A second current source is coupled to receive a third current from a transconductance amplifier of the PLL circuitry for providing a second portion of the first current under control of the third current. The second portion of the first current is proportional to the third current. A third current source provides a third portion of the first current selectively proportional to one of the second and third currents. A switching circuit is coupled to receive the second and third currents for selectively controlling the third current source to couple to one of the second and third currents in order to cause the third portion of the first current proportional to the selected one of the second and third currents such that the first current can be switched to have one of a first current ratio and a second current ratio between the second and third currents and therefore the PLL circuitry can be switched between a first and a second bandwidth and loop gain.

15 Claims, 9 Drawing Sheets

PHASE LOCKED LOOP CIRCUITRY WITH VARIABLE GAIN AND BANDWIDTH

FIELD OF THE INVENTION

The present invention pertains to the field of phase locked loop systems. More particularly, this invention relates to a phase locked loop system with a variable gain and bandwidth current source.

BACKGROUND OF THE INVENTION

Phase locked loop systems are well known in the prior art. These loops are typically used to maintain stable frequency, phase and other circuit parameters. Phase locked loops must have stable and controlled operating characteristics, immune to voltage, temperature and circuit fabrication variations. This is especially so during the operation of the phase locked loop when environmental conditions can change readily.

Figure 1A:
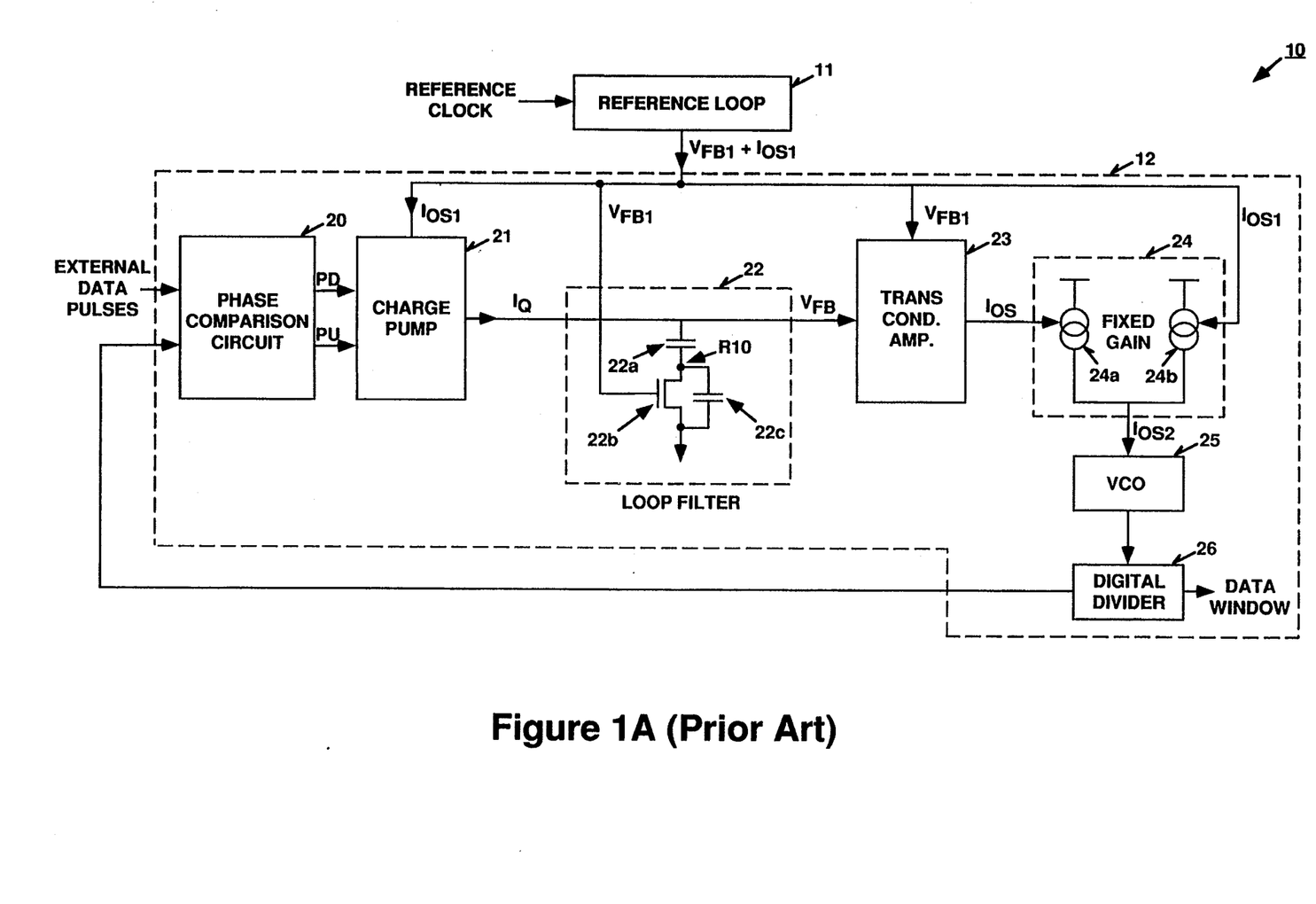
FIG. 1A is a block diagram of a prior art phase locked loop.
Figure 1E:
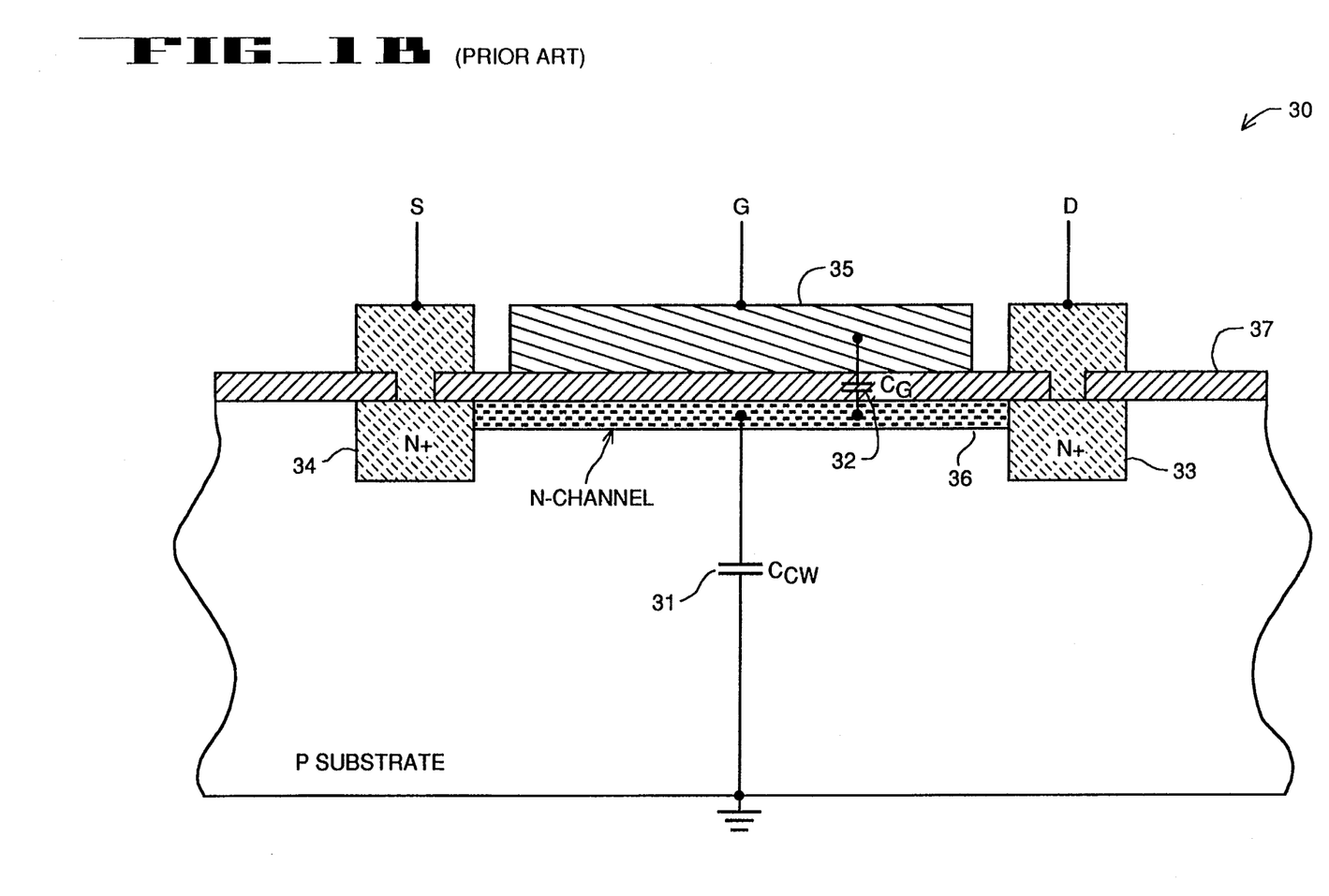
FIG. 1B is a schematic diagram illustrating a prior art integrated capacitor and its related parasitic capacitance.

One type of prior art integrated phase locked loop typically uses a secondary loop to control the loop parameters which are also immune to temperature, process, and other operating environment variations. This type of prior art dual loop phase locked loop is described in U.S. Pat. No. 4,829,258, issued on May 9, 1989, and entitled STABILIZED PHASE LOCKED LOOP. FIG. 1 illustrates in block diagram form the structure of the prior art dual loop phase locked loop.

As can be seen from FIG. 1, reference loop 11 of the prior art dual loop phase locked loop 10 provides analog trim signals $V_{FB1}$ and $I_{OS1}$ to charge pump 21, loop filter 22, transconductance amplifier 23, and fixed gain current source 24 of primary loop 12 of phase locked loop 10. The analog trim signals $V_{FB1}$ and $I_{OS1}$ are used to compensate for various parameter variations in primary loop 12. This allows the prior art dual loop phase locked loop to be immune to process and operating environment variations. Furthermore, the loop can be programmed to different data rates by adjusting the reference clock signal.

Disadvantage are, however, associated with the prior art dual loop phase locked loop. One disadvantage is that the loop gain and bandwidth of the prior art dual loop phase locked loop cannot be adjusted to satisfy different performance requirements after the prior art phase locked loop is fabricated. Typically, a floppy disk drive that employs a phase locked loop to detect and lock onto incoming data stream has a large amount of jitter. However, the floppy disk drive typically has a very little instantaneous speed variation. A tape drive that may also employ a phase locked loop to detect and lock onto incoming data stream has a large instantaneous speed variation, but a very little jitter. As is known, jitter tolerance and instantaneous speed variation tolerance are opposing requirements for a single phase locked loop design. In order for a phase locked loop to have a good jitter tolerance, narrower bandwidth and lower loop gain are needed. On the other hand, broader bandwidth and higher loop gain are required for the phase locked loop be to more nimble to respond to the instantaneous speed variation. Therefore, a phase locked loop that has fine tuned bandwidth and loop gain for a floppy disk drive cannot be fine tuned for a tape drive. Likewise, a phase locked loop that has fine tuned bandwidth and loop gain for tape drive cannot be fine tuned for a floppy disk drive.

SUMMARY AND OBJECTS OF THE INVENTION

One of the objects of the present invention is to provide phase locked loop circuitry that can be readily optimized for different peripheral controllers.

Another object of the present invention is to provide phase locked loop circuitry, the bandwidth and loop gain of which can be adjusted for different peripheral controllers.

Another object of the present invention is to provide phase locked loop circuitry that allows both the bandwidth and loop gain to be optimized dynamically.

A further object of the present invention is to provide phase locked loop circuitry that allows both the bandwidth and loop gain of the circuitry to be optimized dynamically on a single substrate for the peripheral controller to which the phase locked loop circuitry couples.

Another object of the present invention is to provide phase locked loop circuitry fabricated by a cost effective standard digital metal-oxide-semiconductor process.

An adjustable current source circuit of a phase locked loop (PLL) circuitry fabricated on a single substrate provides a first current that is a function of an error voltage proportional to an amount of a phase difference of a comparison of a reference signal and a feedback signal. The circuit includes a first current source coupled to receive a second current from a reference phase locked loop of the PLL circuitry for providing a first portion of the first current under control of the second current. The first portion of the first current is proportional to the second current. A second current source is coupled to receive a third current from a transconductance amplifier of the PLL circuitry for providing a second portion of the first current under control of the third current. The second portion of the first current is proportional to the third current. A third current source provides a third portion of the first current selectively proportional to one of the second and third currents. A switching circuit is coupled to receive the second and third currents for selectively controlling the third current source to couple to one of the second and third currents in order to cause the third portion of the first current proportional to the selected one of the second and third currents such that the first current can be switched to have one of a first current ratio and a second current ratio between the second and third currents and therefore the PLL circuitry can be switched between a first and a second bandwidth and loop gain.

A circuitry for providing a phase locked loop fabricated on a single substrate includes a phase comparator coupled to receive an input signal and a feedback signal for providing a comparison of the input signal and the feedback signal at an output. A filter circuit is coupled to the phase comparator for filtering the comparison of the input signal and the feedback signal and for generating an error voltage proportional to an amount of a phase difference of the comparison of the input signal and the feedback signal. A transconductance amplifier is coupled to the filter circuit for receiving the error voltage and for providing a first current that is a function of the error voltage. A reference phase locked loop is coupled to receive a reference signal having a predetermined phase and a reference feedback signal for providing a second current that is a function of a reference error voltage proportional to an amount of a phase difference of a comparison of the reference signal and the reference feedback signal. The second current compensates for phase of the reference feedback signal such that the reference feedback signal will have an approximately equivalent phase as the reference signal. A current source is coupled to receive the first current from the transconductance amplifier and the second current from the reference phase locked loop for generating a third current that is a function of the first and second currents. The current source provides a selectable ratio of the first and second currents in the third current such that the circuitry for providing a phase locked loop will have an adjustable bandwidth and loop gain. The current source further comprises a first current source coupled to receive the second current from the reference phase locked loop for providing a first portion of the third current under control of the second current. The first portion of the third current is proportional to the second current. A second current source is coupled to receive the first current from the transconductance amplifier for providing a second portion of the third current under control of the first current. The second portion of the third current is proportional to the first current. A third current source provides a third portion of the third current selectively proportional to one of the first and second currents. A switching circuit is coupled to receive the first and second currents for selectively controlling the third current source to couple to one of the first and second currents in order to cause the third portion of the third current proportional to the selected one of the first and second currents such that the third current can be switched to have one of a first current ratio and a second current ratio between the first and second currents and therefore the circuitry can be switched between a first and a second bandwidth and loop gain. A multivibrator is coupled to the current source for receiving the third current and for providing the feedback signal to the phase comparator. When the error voltage changes according to the comparison, the third current changes accordingly to change the phase of the feedback signal such that the feedback signal will have an approximately equivalent phase as the input signal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 2:
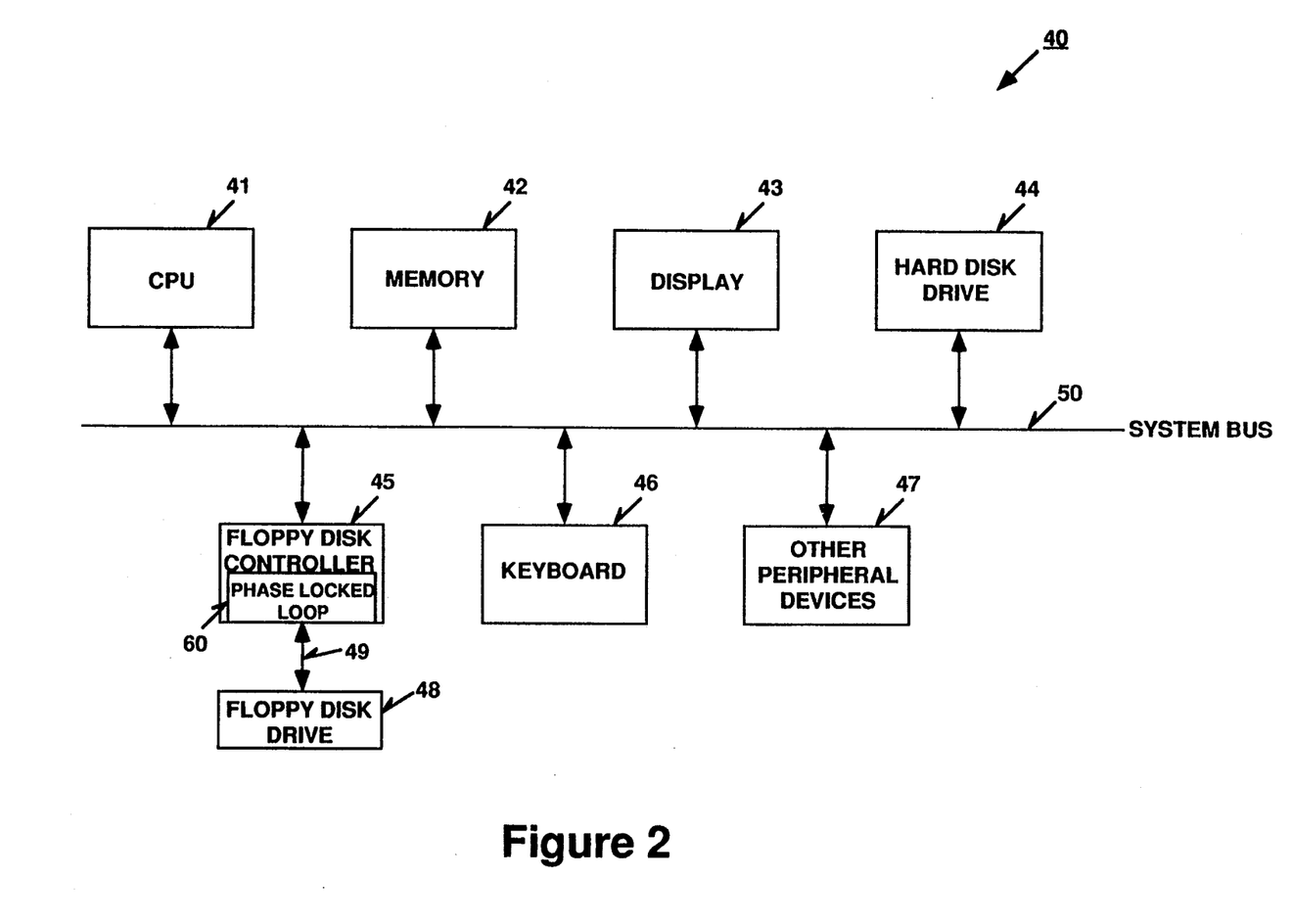
FIG. 2 is a block diagram of a computer system that includes a floppy disk drive that has a phase locked loop.

FIG. 2 schematically illustrates in block diagram form the architecture of a computer system 40 having a floppy disk controller 45, which includes a phase locked loop 60 that implements an embodiment of the present invention.

Figure 3:
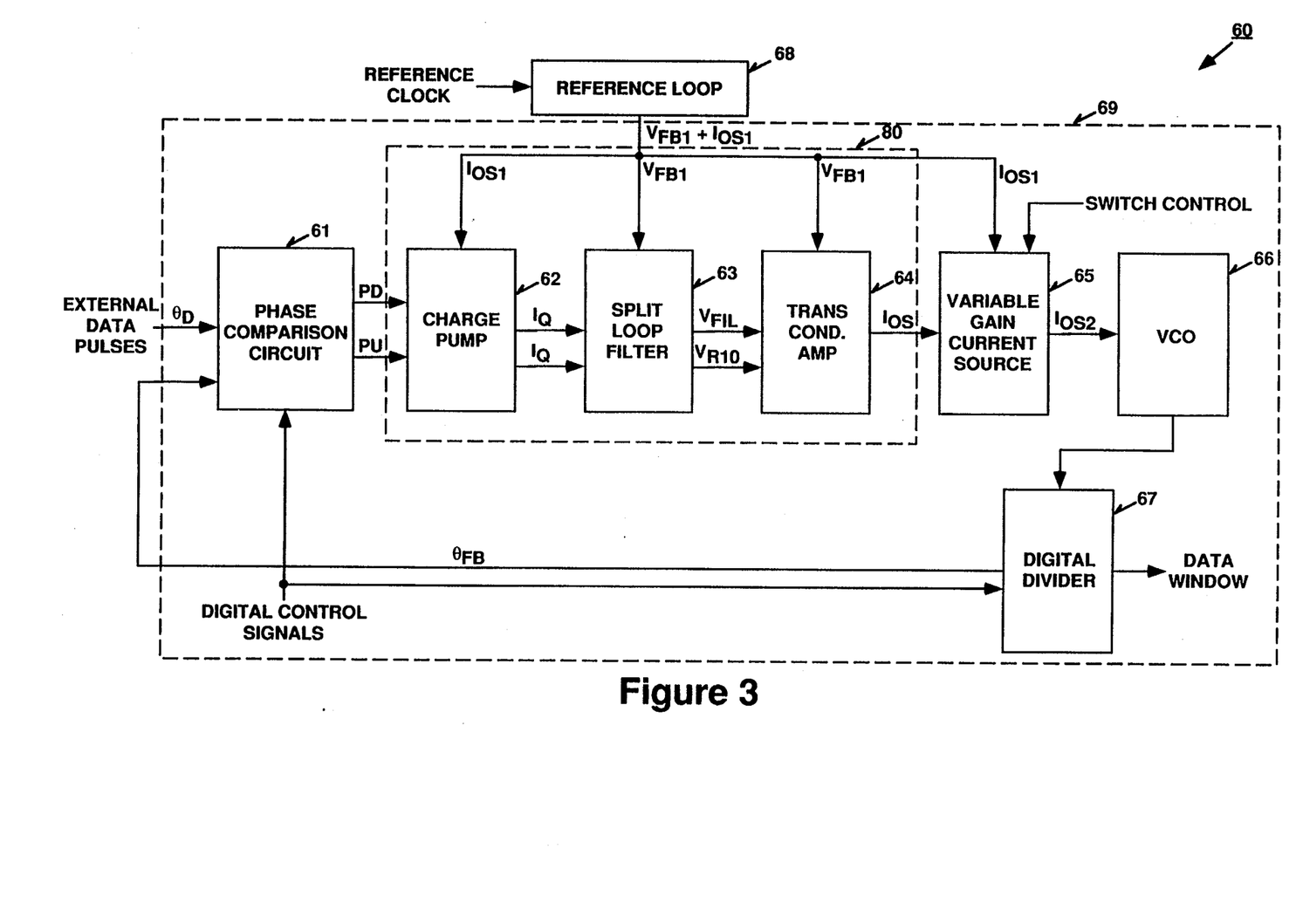
FIG. 3 is a block diagram illustrating circuitry of the phase locked loop of FIG. 2.

FIG. 3 illustrates in block diagram form the circuitry of phase locked loop ("PLL") 60 that includes a phase comparison circuit 61, a charge pump 62, a split loop filter 63, a transconductance amplifier 64, a variable gain current source 65, a voltage controlled oscillator ("VCO") 66, and a digital divider 67. As will be described in more detail below, charge pump 62 includes two identical charge pumps, each being coupled to one of two circuit branches of split loop filter 63. Each circuit branch of filter 63 is coupled to one of two identical transconductance amplifiers of amplifier 64. The output currents from the two amplifiers of amplifier 64 are then summed to cause variable gain current source 65 to generate a current that controls VCO 66 to generate a feedback signal to phase comparison circuit 61 that has an approximately equivalent average phase and frequency as the external data pulses applied to phase comparison circuit 61.

Referring to FIG. 2, computer system 40, in one embodiment, is a personal computer system. For alternative embodiments, computer system 40 comprises a portable computer, a workstation, a minicomputer, a mainframe, or any other type of computer or microprocessor based equipment.

Computer system 40 includes a central processing unit ("CPU") 41. For one embodiment, CPU 41 includes a microprocessor, a co-processor, a cache, and a cache controller for handling access to the cache by the microprocessor.

CPU 41 is coupled to a system bus 50 of computer system 40. System bus 50 is used in computer system 40 as the backplane bus for transfer of data among various components of computer system 40.

Computer system 40 includes memory 42 accessed by CPU 41 via system bus 50. Memory 42 stores programs and data that are needed for the operation of computer system 40. Memory 42 may include random access memories ("RAMs"), read only memories ("ROMs"), EPROMs, flash EPROMs, and other types of memories.

Computer system 40 also includes a keyboard 46, a display 43, and a hard disk drive 44 coupled to system bus 50. Computer system 40 also includes other peripheral devices 47 that are connected to system bus 50. These other peripheral devices include a modem, a serial communication controller, a local area network ("LAN"), and a parallel communication controller.

Computer system 40 further includes floppy disk controller 45 and floppy disk drive 48 connected to floppy disk controller 45 via line 49. Floppy disk controller 45 is connected to system bus 50. Floppy disk drive 48 is used to store programs and data that are needed for the operation of computer system 40. Floppy disk controller 45 transmits and receives data to and from various components of computer system 40 via system bus 50. Floppy disk controller 45 also includes PLL 60. PLL 60 is used in floppy disk controller 45 to generate an internal clock signal for floppy disk controller 45 that is synchronized to the incoming data. The synchronized clock, hereinafter referred to as DATA WINDOW signal, is used to sample the incoming serial data internally. The DATA WINDOW signal generated by PLL 60 also tracks fluctuations in the incoming data frequency.

Alternatively, floppy disk drive 48 can be replaced with a tape drive or other data storage or serial data communication devices.

FIG. 3 illustrates in block diagram form the circuitry of PLL 60 of FIG. 2, which implements an embodiment of the present invention. PLL 60 includes a reference loop 68 and a primary loop 69. In one embodiment, reference loop 68 and primary loop 69 of PLL 60 are implemented on a single semiconductor substrate using MOS digital technology.

Reference loop 68 receives a reference clock signal REFERENCE CLOCK. Reference loop 68 provides analog trimming signals $V_{FB1}$ and $I_{OS1}$ to various elements of primary loop 69, which will be described in more detail below. Primary loop 69 is controlled by the trimming signals $V_{FB1}$ and $I_{OS1}$ from reference loop 68 in such a way that the transfer function of loop 69 is independent of process, temperature, and supply voltage variations. Thus, primary loop 69 is controlled by the REFERENCE CLOCK signal only. This allows primary loop 69 to be adjusted to different input data rates by simply adjusting the frequency of the REFERENCE CLOCK signal. The circuitry of reference loop 68 is described as secondary loop in U.S. Pat. No. 4,829,258, entitled STABILIZED PHASE LOCKED LOOP. The subject matter of the above-referenced patent is hereby incorporated by reference.

Primary loop 69 includes phase comparison circuit 61, charge pump 62, split loop filter 63, transconductance amplifier 64, variable gain current source 65, VCO 66, and digital divider 67. Digital divider 67 provides the DATA WINDOW signal and a feedback signal $\theta_{FB}$. Phase comparison circuit 61 receives external data pulses $\theta_D$ from floppy disk drive 48 (FIG. 2) via line 49 FIG. 2) as an input. The external data pulse $\theta_D$ may also come from other data devices such as a tape drive. The external data pulses $\theta_D$ may also come from other components of computer system 40. Phase comparison circuit 61 also receives as an input the feedback signal $\theta_{FB}$ from digital divider 67. The feedback signal $\theta_{FB}$ provides the closed loop feedback for maintaining the phase lock of PLL 60.

Phase comparison circuit 61 compares the external data pulses $\theta_D$ and the feedback signal $\theta_{FB}$ by comparing the phase of the two signals $\theta_D$ and $\theta_{FB}$ whenever $\theta_D$ occurs. Phase comparison circuit 61 generates a loop filter pump up signal PU and a loop filter pump down signal PD. The PU and PD signals are applied to charge pump 62 to activate current sources in charge pump 62 which either source or sink currents $I_Q$ to filter 63. This in turn then causes a respective change in the output voltages $V_{FIL}$ and $V_{R10}$ of filter 63. As shown in FIG. 3, trimming signal $I_{OS1}$ from reference loop 68 is coupled to charge pump 62 to compensate for process, temperature, and power supply variations.

Functionally, when PLL 60 is in a locked condition, $\theta_D$ and $\theta_{FB}$ will have their phases synchronized such that phase comparison circuit 61 does not activate the PU and PD signals. At this time, both PU and PD signals are logically inactively high. However, whenever the two input signals $\theta_D$ and $\theta_{FB}$ are not in phase, the PU or PD signal will be activated depending on the direction of the phase error, and the duration of the activated signal of the PU and PD signals determines the amount of the error.

Phase comparison circuit 61 also includes a digital control logic (not shown). Digital control signals from the control sources external to PLL 60 are coupled to the digital control logic of phase comparison circuit 61 to provide synchronization and control to circuit 61. The digital control logic of phase comparison circuit 61 also generates a reference signal for circuit 61 that provides continuous clock pulses for synchronization to a nominal frequency when the external data pulses $\theta_D$ are not present at the input.

The output currents $I_Q$ of charge pump 62 are coupled to filter 63. Filter 63 is a low pass RC loop filter. Filter 63 includes two inputs, each being coupled to charge pump 62 for receiving the $I_Q$ current. Therefore, filter 63 receives $2I_Q$ currents from charge pump 62. Filter 63 also receives the trimming signal $V_{FB1}$ from reference loop 68 to control and adjust its loop parameters to be free from process, temperature, and power supply variations. The circuitry of filter 63 will be described in more detail below, in conjunction with FIGS. 4-5B.

Filter 63 has a transfer function F(s) that is determined by the RC parameter of the filter. Filter 63 includes both a pole and a zero. The zero is required for maintaining the stability of the loop filter. Filter 63 filters the error information received when PLL 60 is not in the locked condition. Filter 63 outputs voltages $V_{FIL}$ and $V_{R10}$ to transconductance amplifier 64. The $V_{FIL}$ and $V_{R10}$ are error feedback voltages of PLL 60, the magnitude change of the sum of the $V_{FIL}$ and $V_{R10}$ voltages being proportional to the integrated phase error between $\theta_D$ and $\theta_{FB}$ and driving the frequency of VCO 66. Functionally speaking, filter 63 performs the substantially same circuit function in PLL 60 as that of filter 22 in the prior art PLL 10 of FIG. 1. The sum of $V_{FIL}$ and $V_{R10}$ voltages generated by filter 63 is equivalent to the $V_{FB}$ voltage in FIG. 1A. However, the circuit formation of filter 63 is different from the circuit formation of prior art filter 22 of FIG. 1A. Filter 63 is such formed that the capacitors within filter 63 are free of parasitic capacitance and are independent of each other. This is achieved by coupling each of the capacitors of filter 63 to ground while still achieving the same circuit function as that of loop filter 22. The circuit of filter 63 will be described in more detail below, in conjunction with FIGS. 4-5B.

Referring back to FIG. 3, when PLL 60 is in the locked condition, the sum of $V_{FIL}$ and $V_{R10}$ voltages will have a value of corresponding to zero error. When $\theta_D$ phase leads that of $\theta_{FB}$, then the sum of the $V_{FIL}$ and $V_{R10}$ voltages will vary in one direction (in this case be pumped up) from its prior value. When $\theta_D$ phase lags that of $\theta_{FB}$, then the sum of the $V_{FIL}$ and $V_{R10}$ voltages will vary in the opposite direction (in this case be pumped down) from its prior value.

The $V_{FIL}$ and $V_{R10}$ voltages are coupled as an input to transconductance amplifier 64, the circuitry of which will be described in more detail below, in conjunction with FIGS. 4 and 6. Amplifier 64 has a transformation value of $K_T$. Each of the $V_{FIL}$ and $V_{R10}$ voltages is amplified by a factor of $K_T$ and converted into current form. The corresponding currents of the $V_{FIL}$ and $V_{R10}$ voltages are then summed to provide an $I_{OS}$ current that is applied to a variable gain current source 65. In other words, the $I_{OS}$ current is proportional to the sum of the $V_{FIL}$ and $V_{R10}$ voltages. Amplifier 64 also receives the trimming signal $V_{FB1}$ from reference loop 68.

The function of transconductance amplifier 64 in PLL 60 is the same as that of transconductance 23 in the prior art PLL 10 of FIG. 1. In addition, amplifier 64 sums up the currents generated in accordance with the $V_{FIL}$ and $V_{R10}$ voltages to provide the $I_{OS}$ current. As will be described in more detail below in conjunction with FIG. 4, amplifier 64 includes two identical transconductance amplifiers, each being coupled to receive one of the $V_{FIL}$ and $V_{R10}$ voltages. Each of the two amplifiers then amplifies and converts the respective one of the $V_{FIL}$ and $V_{R10}$ voltages into current form. The output currents from each of the two amplifiers of amplifier 64 are then summed to become the $I_{OS}$ current.

The $I_{OS}$ current is then applied to variable gain current source 65 with the $I_{OS1}$ current from reference loop 68 to generate an $I_{OS2}$ current to VCO 66. The $I_{OS}$ current is amplified in variable gain current source 65 by a factor of $K_V$ with the $I_{OS1}$ current to become the $I_{OS2}$ current. The $I_{OS2}$ current controls the frequency of the output signal of VCO 66. The frequency of the output signal of VCO 66 is directly proportional to the amount of current $I_{OS2}$. For example, if $\theta_{FB}$ has a lower frequency than $\theta_D$, phase comparison circuit 61 and filter 63 will increase the sum of the feedback voltages $V_{FIL}$ and $V_{R10}$ and amplifier 64 will increase the $I_{OS}$ current such that the $I_{OS2}$ current is increased accordingly to increase the frequency of $\theta_{FB}$ to coincide with $\theta_D$. When $\theta_{FB}$ has a higher frequency than $\theta_D$, the sum of the $V_{FIL}$ and $V_{R10}$ voltages and the $I_{OS}$ current are accordingly reduced. This causes the frequency of $\theta_{FB}$ to reduce so as to coincide with $\theta_D$.

Current source 65 also receives the $I_{OS1}$ current from reference loop 68 to control the output current $I_{OS2}$ of current source 65 independent of process, temperature, and power supply variations. The $I_{OS1}$ current is also used to stabilize the frequency of primary loop 69.

Current source 65 mixes the $I_{OS}$ and $I_{OS1}$ currents. The ratio of the $I_{OS}$ and $I_{OS1}$ currents determines the bandwidth of VCO 66. Current source 65 allows the ratio of the $I_{OS}$ and $I_{OS1}$ currents to vary, thus allowing the bandwidth of VCO 66 to be adjusted. The adjustment of the ratio of the $I_{OS}$ and $I_{OS1}$ currents is done by a SWITCH CONTROL signal external to current source 65. The SWITCH CONTROL signal controls currents source 65 to switch between different current ratios of the $I_{OS}$ and $I_{OS1}$ currents. This allows current source 65 and thus VCO 66 to be tuned both in terms of loop gain and bandwidth for different peripheral devices. As described above, floppy disk drive 48 of FIG. 2 can be a tape drive which requires broader bandwidth and higher loop gain than a floppy disk drive.

Current source 65, in one embodiment of the present invention, allows the bandwidth and loop gain of VCO 66 to be adjusted by adjusting the current ratio of the $I_{OS}$ and $I_{OS1}$ currents applied to current source 65. Current source 65 achieves this by providing switching mechanism that switches among different current ratios of the $I_{OS}$ and $I_{OS1}$ currents. Therefore, VCO 66 as well as PLL 60 (FIG. 3) are allowed to have the optimum bandwidth and loop gain for each of different peripheral devices within which PLL 60 is used.

As will be described in more detail below in connection with FIG. 7, in one embodiment, current source 65 includes two current ratios of the $I_{OS}$ and $I_{OS1}$ currents, one for the requirement of a floppy disk drive and another for a tape drive. In other embodiments, current source 65 provides more than two current ratios for more than two types of serial peripheral devices. As is known, different serial peripheral devices require different PLL characteristics. For example, a floppy disk drive has a large amount of jitter but very little instantaneous speed variation while a tape drive has a large amount of instantaneous speed variation but less jitter. Jitter tolerance and instantaneous speed variation tolerance are opposing requirements for a single PLL design. In order to obtain good jitter tolerance margin, narrower bandwidth and lower gain are required for VCO 66 and therefore PLL 60. However, broader bandwidth and higher gain are required in order to make the PLL more nimble to respond to the instantaneous speed variation.

Because current source 65 is provided wit the switching mechanism, VCO 66 and hence PLL 60 is allowed to be in tuned between (1) the high gain and broad bandwidth and (2) low gain and narrow bandwidth. As described above, the adjustment is made through the adjustment of the current ratio of the $I_{OS}$ and $I_{OS1}$ currents to current source 65. The circuitry of variable gain current source 65 and the function of the SWITCH CONTROL signal will be described in more detail below, in conjunction with FIG. 7.

VCO 66 is a multivibrator whose frequency is determined by the $I_{OS2}$ current (i.e., the comparison of the $\theta_D$ and $\theta_{FB}$ signals). VCO 66 output signal is divided by digital divider 67 to produce the signal $\theta_{FB}$. Thus, the frequency of $\theta_{FB}$ is also determined by the $I_{OS2}$ current.

The output of VCO 66 is coupled to digital divider 67. Divider 67 generates the $\theta_{FB}$ signal to phase comparison circuit 61. Divider 67 is used to reduce the frequency of the output of VCO 66 to generate the $\theta_{FB}$ signal. In one embodiment, the $\theta_{FB}$ is selected as ½ or ¼ of the frequency of the output of VCO 66. Digital divider 67 provides the DATA WINDOW signal which is used by an external memory accessing circuit to determine when valid data is present for accessing. Digital control signals are also applied to digital divider 67 to provide synchronization and control of the divider.

During operation, PLL 60 is a closed loop system having one input $\theta_D$. The output of VCO 66 provides the closed loop feedback signal $\theta_{FB}$ for maintaining the phase lock of PLL 60. When the data pulses $\theta_D$ are received at phase comparison circuit 61, they are compared against the feedback signal $\theta_{FB}$ in circuit 61. As described above, the digital control logic in phase comparison circuit 61 generates clock pulses when the data pulses $\theta_D$ are not present at the input. If the phase of the $\theta_D$ signal is equal to the phase of $\theta_{FB}$, then no adjustment is made because PLL 60 is in the locked condition. At this time, the PU and PD signals are both inactive that causes the $I_{OS}$ current to be at error free value. The error free value of the $I_{OS}$ current then causes VCO 66 to generate the $\theta_{FB}$ signal in phase with the $\theta_D$ signal.

When the comparison results in a difference of the phase of the two signals $\theta_D$ and $\theta_{FB}$, then either the PD or PU signal is activated, depending on the direction of the difference from the error free value. The activated one of the PU and PD signals then causes the $I_Q$ current generated by charge pump 62 to push the loop towards the new phase/frequency condition. The amount of change in the phase and/or frequency is proportional to the charge ($I_Q$ times the length of the phase difference between the $\theta_D$ and $\theta_{FB}$ signals) pumped out of charge pump 62. This charge is integrated by filter 63 to generate the error voltages $V_{FIL}$ and $V_{R10}$. The magnitude change of the sum of the $V_{FIL}$ and $V_{R10}$ voltages is proportional to the amount of the difference of the pulse frequencies of $\theta_D$ and $\theta_{FB}$ at the start of the capture process. The $V_{FIL}$ and $V_{R10}$ voltages are then amplified by transconductance amplifier 64, and converted and summed to become the $I_{OS}$ current. The $I_{OS}$ current is then mirrored by current source 65 to generate the $I_{OS2}$ current which is a function of the sum of the $V_{FIL}$ and $V_{R10}$ voltages. The $I_{OS2}$ is then applied to VCO 66 to generate the $\theta_{FB}$ feedback signal via digital divider 67. The frequency of the $\theta_{FB}$ signal generated by VCO 66 is directly proportional to the amount of the $I_{OS2}$ current such that PLL 60 is brought back to the locked condition.

Figure 4:
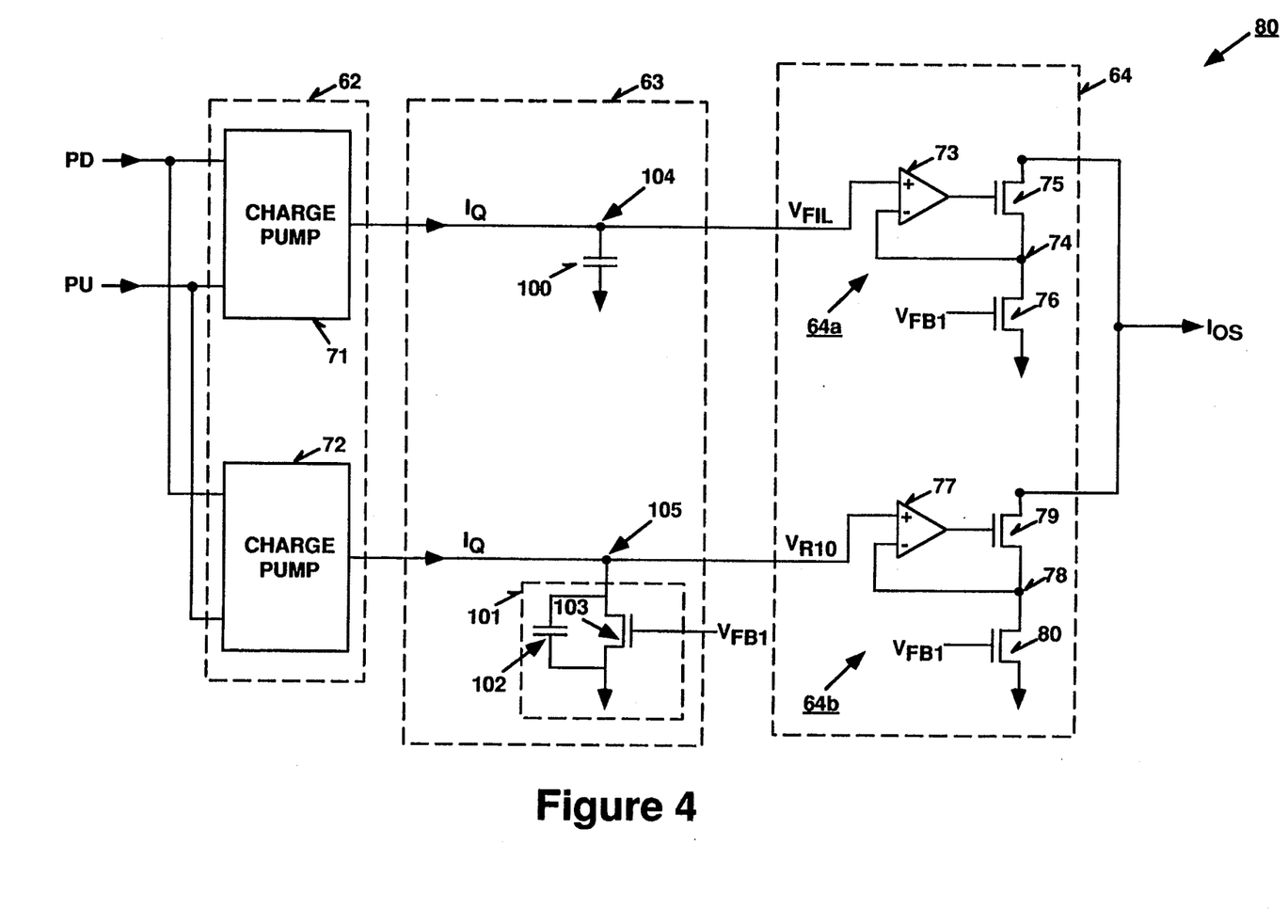
FIG. 4 is a circuitry diagram of a change pump, a split loop filter, and a transconductance amplifier of the phrase locked loop of FIG. 3.

FIG. 4 illustrates the circuitry of loop filter 63 and transconductance amplifier 64, according to one embodiment of the present invention. FIG. 4 also illustrates in block diagram form the circuitry of charge pump 62. Referring to FIG. 4, charge pump 62 includes two identical charge pumps 71 and 72, each coupled to receive the PU and PD signals. Each of charge pumps 71-72 generates the $I_Q$ current at its output.

The above described embodiment has identical charge pumps and currents $I_Q$, but this is not necessary. Two independent charge pumps allow the $V_{FIL}$ and $V_{R10}$ nodes to be charged by different currents. This allows an additional means to independently vary the loop characteristics. For instance, in the current embodiment, scaling the $I_Q$ currents has the effect of scaling the components in filter 63 attached to that particular charge pump.

Filter 63 includes two circuit branches, each coupled to one of charge pumps 71-72 of pump 62. The first branch includes a capacitor 100 coupled between node 104 and ground. Node 104 receives the $I_Q$ current from charge pump 71. Capacitor 100 then generates $V_{FIL}$ at node 104. The second branch is a RC circuit 101 that includes a capacitor 102 and a transistor 103 coupled in parallel between node 105 and ground. Transistor 103 acts as a voltage controlled resistor and the gate of transistor 103 receives the $V_{FB1}$ voltage to control the resistance value of transistor 103. In fact, transistor 103 is a voltage controlled resistor. Capacitor 102 is used in the filter circuit for stability purposes. RC circuit 101 is coupled to charge pump 72 at node 105 to receive the $I_Q$ current. RC circuit 101 generates the $V_{R10}$ voltage at node 105. The $V_{FIL}$ and $V_{R10}$ voltages are then applied to transconductance amplifier 64.

The sum of the loop voltages $V_{FIL}$ and $V_{R10}$ directly indicate the frequency at which VCO 66 should be running. Each of these voltages plays a different role in the PLL capture and frequency tracking/jitter rejection characteristics. $V_{FIL}$ is a simple integration of all the charge that is sent from its charge pump onto capacitor 100 in FIG. 4. Ignoring leakage, $V_{FIL}$ will not change value without being pumped from the charge pump. $V_{R10}$ is also an integration of charge on capacitor 102, except that resistor 103 connected in parallel to capacitor 102 limits the voltage on $V_{R10}$ and causes it to discharge to zero during times when the charge pump is not pumping. Thus, at lock when there is no phase difference on the inputs of the phase comparator and therefore no pumping, $V_{R10}$ has discharged to zero and $V_{FIL}$ alone controls the VCO frequency. $V_{FIL}$ acts as the frequency memory for the loop.

$V_{R10}$ acts only when there is phase difference on the inputs of the phase comparator and pumping is required to re-acquire lock. In a typical loop, capacitor 102 is 10 to 20 times smaller than capacitor 100. This means that capacitor 102 will charge up faster than capacitor 100. It also charges in a direction that causes the VCO frequency to change frequency faster than with $V_{FIL}$ alone. This gives the loop a "boost" towards capturing the new frequency. But it is a transient effect because of the resistor discharging capacitor 102. The amount that $V_{R10}$ changes with respect to $V_{FIL}$ for a given phase error determines how the loop will react to a change in input frequency versus a change due to data jitter.

When a voltage adder is provided in filter 63 to sum up the $V_{FIL}$ and $V_{R10}$ voltages, filter 63 generates the same error feedback voltage $V_{FB}$ that is proportional to the amount of the frequency difference of the $\theta_{FB}$ signal with respect to the $\theta_D$ signal as that of filter 22 of FIG. 1A. In one embodiment, this addition function is performed in amplifier 64 after each of the $V_{FIL}$ and $V_{R10}$ voltages is converted into the current form. Therefore, two identical transconductance amplifiers are needed in amplifier 64. This embodiment is shown in FIG. 4. In another embodiment, an adder is provided in filter 63 to sum up the $V_{FIL}$ and $V_{R10}$ voltages. In this embodiment, only one transconductance amplifier for amplifier 64 is needed.

Capacitors 100 and 102 are shown in FIG. 4 as standard capacitors, but are actually implemented as MOSFET transistors with the upper lead ($V_{FIL}$ and $V_{R10}$ nodes respectively) being the gate of the transistor and the lower lead (connected to ground in both cases) being the source and drain of the transistor connected together. One of the goals of this design is to be low cost. This is best achieved by using a common, digital silicon fabrication process. Digital processes do not have a practical, near-ideal capacitor like the more expensive analog processes. The capacitor formed by the gate oxide has the highest capacitance per area of any available, thereby taking less die area than other means. Since the capacitance needed for filter 63 is relatively large the die area savings can be substantial which further reduces cost. While the MOSFET capacitor is the smallest available, it is not at all an ideal capacitor. There are several parasitic capacitances that come along with the gate capacitance that are a large fraction of the gate capacitance. These parasitic capacitances will become active elements in the filter if the MOSFET capacitors are not connected with the source and drain at ground. An example of such a connection is shown in FIG. 1A for capacitor 22a. In this case the parasitic capacitance appears as a capacitor in parallel to capacitor 22c in FIG. 1A. The parasitic capacitor is not well controlled in the fabrication process, its value is 2 to 4 times too large for capacitor 22c for good loop performance and even if it could be used, its value was always connected to the value of capacitor 22a, making independent variation of these capacitors impossible. Special compensation circuits were used to cancel the parasitic capacitor in the prior art, but these circuits took die area and had other adverse performance impacts on the loop characteristics.

Figure 5A:
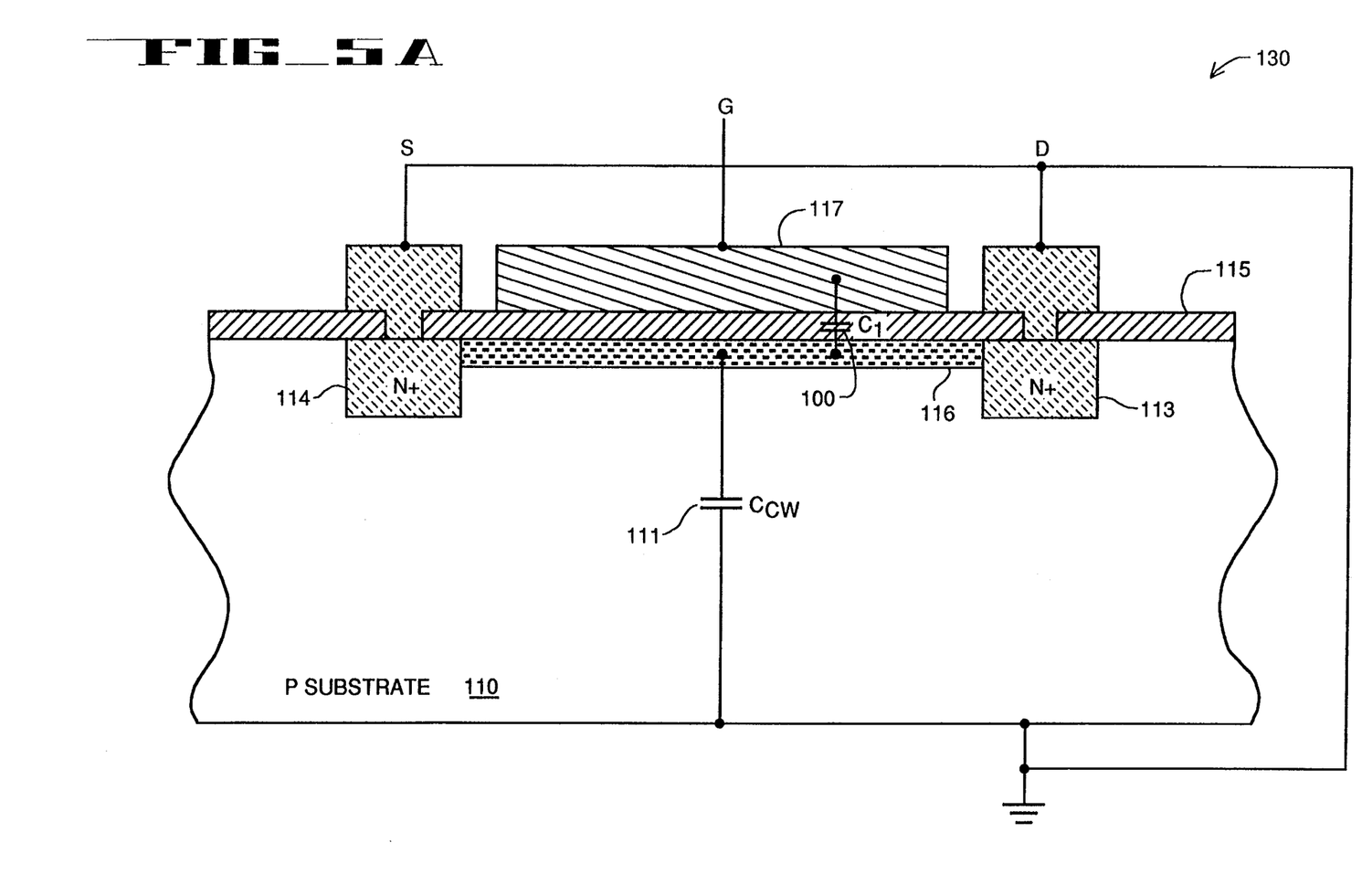
FIGS. 5A and 5B schematically illustrate the formation of the capacitors of the split loop filter of FIG. 4.
Figure 5B:
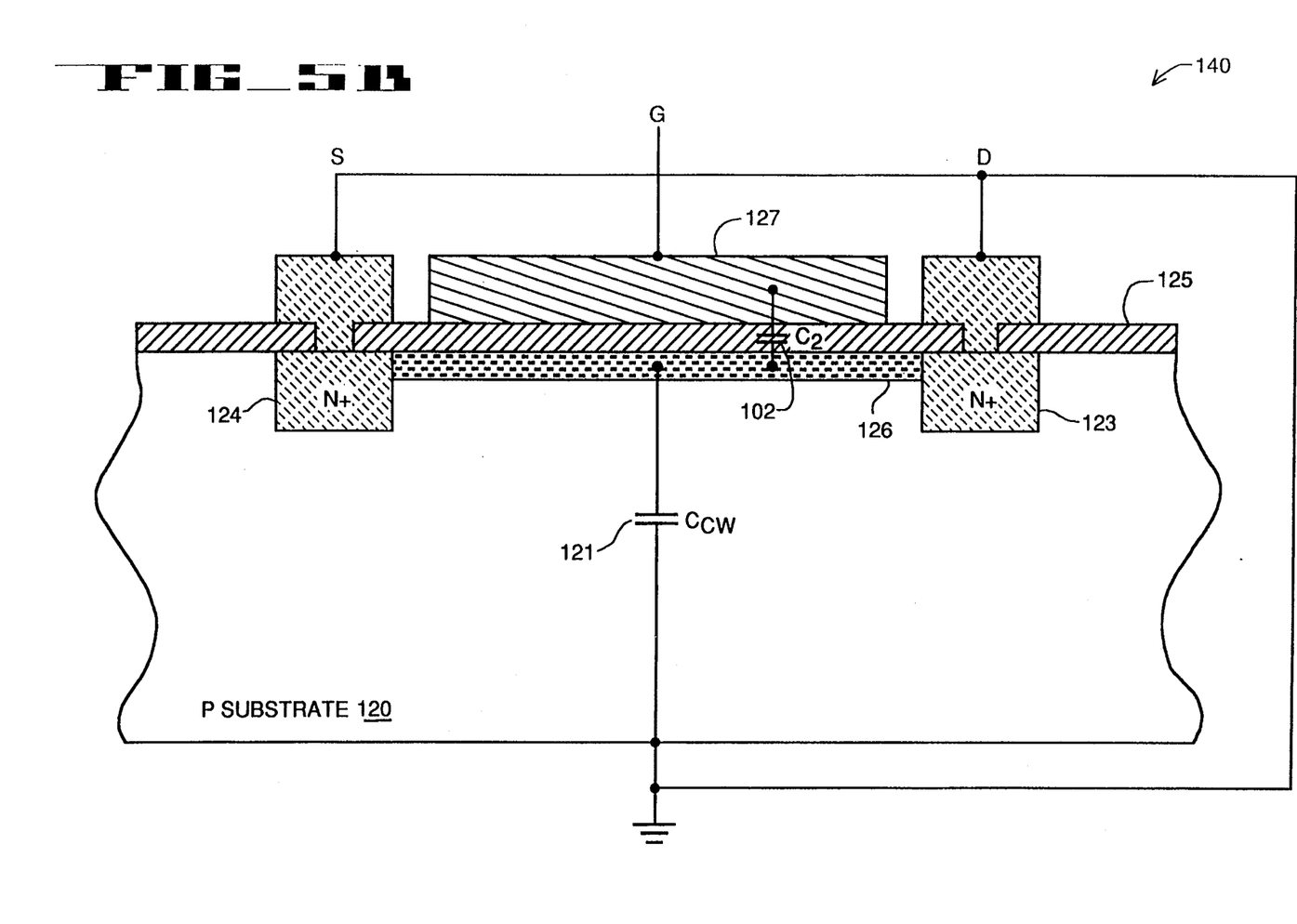

As can be seen from FIG. 4, capacitor 100 is not connected in series with circuit 101. In addition, each of capacitors 100 and 102 is connected to ground. In this case, capacitors 100 and 102 are allowed to be independent of each other. Moreover, the connection for each of capacitors 100 and 102 allows the parasitic capacitance within each capacitor to be canceled out. FIGS. 5A-5B illustrate the formation and connection of capacitors 100 and 102 that eliminates the parasitic capacitance in each capacitor, which will be described below.

Because capacitor 100 is not serially connected with circuit 101, filter 63 as well as PLL 60 can operate in the low power supply environment (e.g., 3 volts). Also, because each of capacitors 100 and 102 is connected to ground, the parasitic capacitance in each capacitor is canceled out such that the capacitance of each of capacitors 100 and 102 is not affected by the existence of the other capacitor. Thus, the capacitance of each capacitor can be accurately set.

Amplifier 64 also includes two identical transconductance amplifiers 64a and 64b. Amplifier 64a receives the $V_{FIL}$ voltage and amplifier 64b receives the $V_{R10}$ voltage. The output currents of amplifiers 64a-64b are then combined to generate the $I_{OS}$ current. The $I_{OS}$ current is proportional to the amount of the difference of the frequencies of the $\theta_D$ and $\theta_{FB}$ signals. The $I_{OS}$ current is then applied to current source 65 (shown in FIG. 3) to control the generation of the $I_{OS2}$ current. As described above, the amount of the $I_{OS2}$ current depends on the $I_{OS}$ and $I_{OS1}$ currents.

As with the charge pumps, transconductance amplifiers 64a and 64b can have different gains, which gives another means to adjust the characteristics of the loop.

Transistors 74 and 75 of amplifier 64a and transistors 79 and 80 of amplifier 64b form a current source controlled by $V_{FIL}$ and $V_{R10}$ respectively. The operational amplifiers 73 and 77 are configured as voltage followers and force $V_{FIL}$ and $V_{R10}$ to be present on nodes 74 and 78 respectively. Transistors 76 and 80 are biased to be voltage controlled resistors whose value is set by $V_{FB1}$ to be independent of process or operating conditions. The current through transistors 76 and 80 are directly proportional to $V_{FIL}$ and $V_{R10}$, and therefore are controlled by the comparison of the $\theta_D$ and $\theta_{FB}$ signals.

The output currents of amplifiers 64a and 64b are then summed together to become the $I_{OS}$ current. The $I_{OS}$ current is then coupled to current source 65 to control the generation of the $I_{OS2}$ current.

Referring now to FIG. 5A, the formation and connection of capacitor 100 of FIG. 4 is shown. As shown in FIG. 5A, capacitor 100 is built in a MOS transistor 130. Transistor 130 includes a P substrate 110, N+ type drain and source regions 113 and 114, and a N− type channel region 116. A polysilicon region 117 forms the gate of transistor 130, and is separated from channel region 116 by an insulating layer 115. Transistor 130 includes a gate-to-channel capacitor $C_1$. Transistor 130 also includes a channel-to-substrate pasitic capacitor $C_{CW}$ 111. By connecting source 114 and drain 113 of transistor 200 together to ground, the $C_{CW}$ capacitor 111 in transistor 130 is canceled out and only the gate-to-channel capacitor $C_1$ is used as capacitor 100 in filter 63. Because capacitor 100 of filter 63 (FIG. 4) is coupled to ground, the $C_{CW}$ capacitor is allowed to be canceled out by connection of the drain and source of transistor 130 to ground. If capacitor 100 is serially connected to circuit 101 (FIG. 4), then in order to form capacitor 100 by transistor 130, drain 113 and source 114 of transistor 200 will not be connected to ground while the P substrate 110 is connected to ground. In this case, the capacitance of the parasitic capacitor $C_{CW}$ in transistor 130 cannot be canceled out and will affect the capacitance of the serially connected capacitor in the circuit.

FIG. 5B illustrates the formation and connection of capacitor 102 of filter 63 of FIG. 4. Referring to FIG. 5B, capacitor 102, like capacitor 100 is also a transistor-turned capacitor. As can be seen from FIG. 5B, gate-to-channel capacitor $C_2$ constitutes capacitor 102 FIG. 4) and the parasitic capacitor $C_{CW}$ 121 is canceled out by connecting drain 123 and source 124 of transistor 140 to ground.

Figure 6:
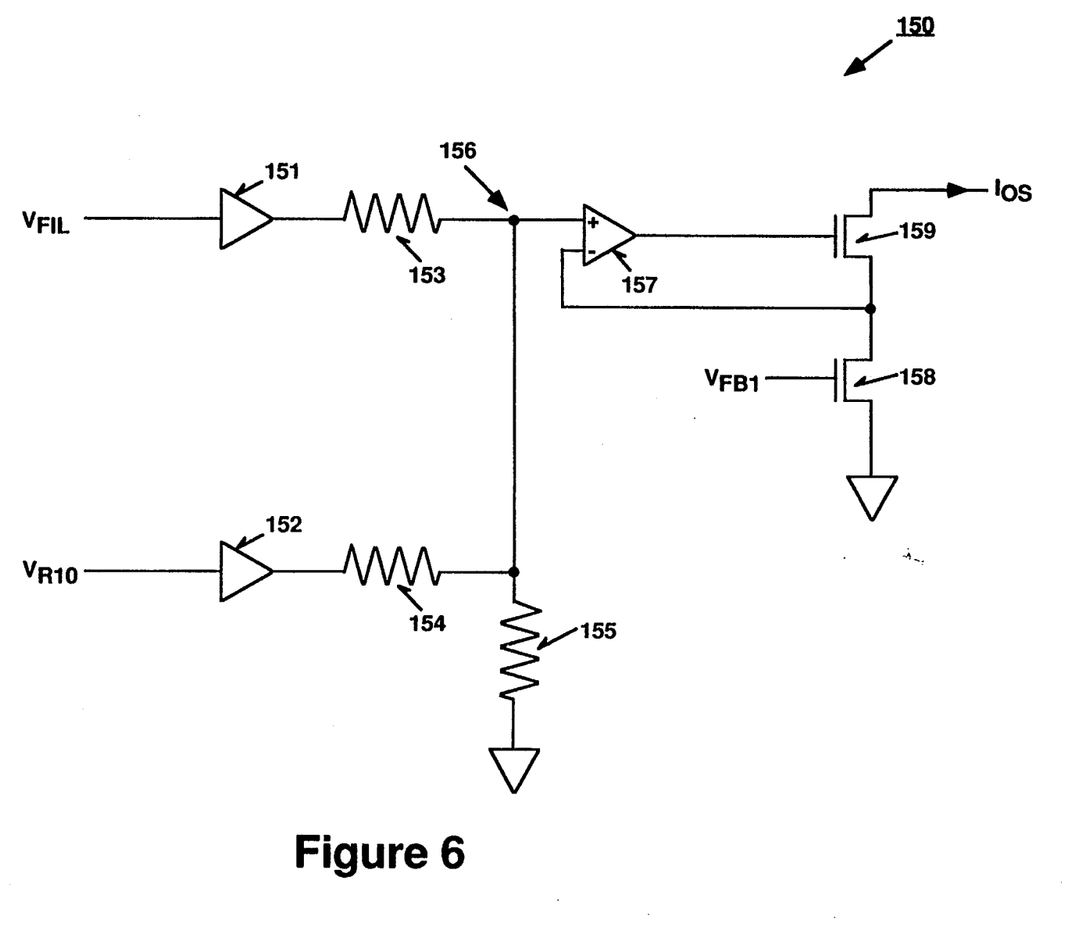
FIG. 6 illustrates another example of the circuitry of the transconductance amplifier of the phase locked loop of FIG. 3.

FIG. 6 illustrates another embodiment of transconductance amplifier 64 of FIG. 4. Referring to FIG. 6, amplifier circuit 150 includes amplifiers 151 and 152, each coupled to receive one of the $V_{FIL}$ and $V_{R10}$ voltages. The output of each of amplifiers 151-152 is then coupled to a respective one of resistors 153-154, through which the amplified voltages are then converted into current form. The currents are then combined at node 156 and form the sum of VFIL and VR10 across resistor 155. This voltage is fed into a standard transconductance amplifier made up of operational amplifier 157 and transistors 158 and 159. Amplifier circuit 150 outputs the IOS current through transistor 159.

Figure 7:
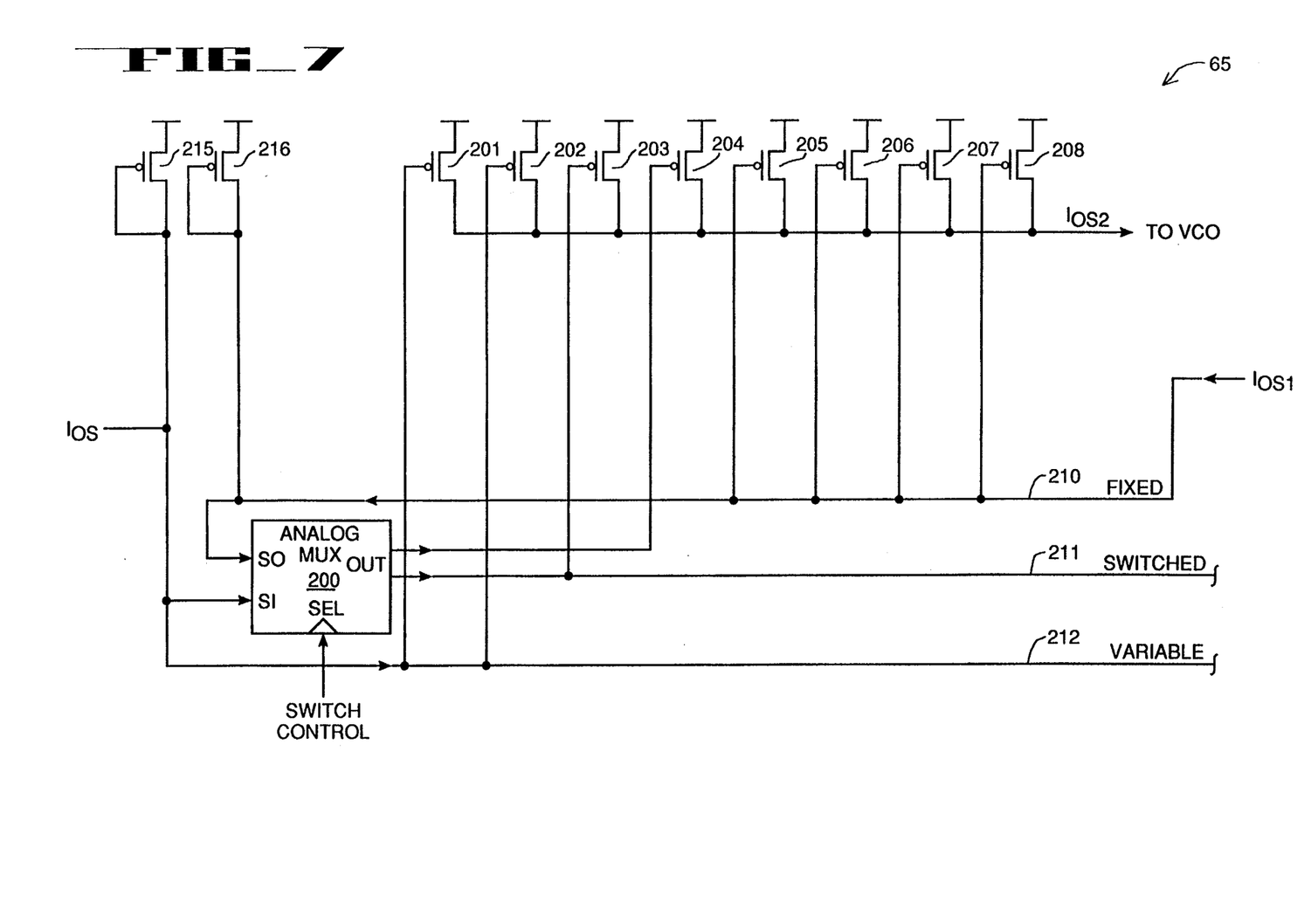
FIG. 7 is a circuitry diagram of the variable gain current source of the phase locked loop of FIG. 3.

Referring to FIG. 7, the circuitry of variable gain current source 65 of FIG. 3 is shown. In FIG. 7, current source 65 includes eight identical transistors 201 though 208, each providing a controlled amount of current to VCO 66 (FIG. 4). The sum of the currents flowing through transistors 201-208 constitutes the $I_{OS2}$ current. Depending on various factors such as the size of a transistor, the required total amount of current for the $I_{OS2}$ current, etc., current source 65 may have more or fewer than eight transistors.

As can be seen from FIG. 7, the current flowing through each of transistors 201-208 is controlled by the voltage at its gate. Therefore, the $I_{OS2}$ current is controlled by the gate voltage to each of transistors 201-208. Moreover, it can be seen from FIG. 7 that a first group of transistors within transistors 201-208 have their gates coupled to receive their gate voltage directly from the line controlled by $I_{OS1}$ current from the referenced loop 68 (FIG. 3). This voltage 210 comes from the voltage that is developed across diode-connected transistor 216 by current $I_{OS1}$. In the present embodiment, transistors 201-208 and 216 are identically sized so the voltage developed across transistor 201-208 and 216 are identically sized so the voltage developed across transistor 216 causes the same $I_{OS1}$ current to be mirrored in each of the transistors in this first group. (Although the current embodiment uses identically sized devices, the sizes of the transistors can be whatever size meeting the requirement of the circuit.) This portion of the $I_{OS2}$ current is said to be fixed since it is controlled by the reference loop and is not affected by incoming data, process or operating conditions.

A second group of transistors within transistors 201-208 have their gates coupled to the line controlled by $I_{OS}$ current from the transconductance amplifier 64 (FIG. 3). This second gate voltage 212 comes from the voltage that is developed across diode-connected transistor 215 by current $I_{OS}$. Transistor 215 is identical to transistor 216 and causes each transistor in the second group of transistors within transistors 201-208 to mirror current $I_{OS}$. This portion of $I_{OS}$ current is variable and is controlled by the loop voltages $V_{FIL}$ and $V_{R10}$. This is the portion of $I_{OS}$ current that controls the VCO frequency changes.

The remaining group of transistors within transistors 201-208 are connected to control voltage 211 such that their gates can be driven from either the line controlled by voltage 210 or voltage 212. The selection of which voltage controls this third group of transistors is made by the SWITCH CONTROL signal into analog multiplexer 200. Depending on the value of the SWITCH CONTROL signal, the transistors within 201-208 that are connected to voltage 211 can be made to mirror either $I_{OS}$ or $I_{OS1}$. Therefore, it can be seen that the SWITCH CONTROL signal controls the ratio of the $I_{OS2}$ current that is controlled by $I_{OS}$ and $I_{OS1}$; the ratio between the fixed and variable portions of the $I_{OS2}$ current. The more of the current that is controlled by $I_{OS}$, the larger the range of minimum and maximum $I_{OS2}$ currents. The range of minimum and maximum $I_{OS2}$ currents is called the VCO bandwidth.

Transistors 201-208, 215 and 216 are p-channel transistors. In another embodiment, all these transistors could be n-channel transistors.

As is described above, the bandwidth of VCO 66 of FIG. 3 is determined by the ratio of the $I_{OS}$ and $I_{OS1}$ currents. The more the amount of the $I_{OS}$ current is, the broader the bandwidth of VCO 66 is. Assume (1) M represents the amount of current in the $I_{OS2}$ current generated in current source 65 under the control of the $I_{OS}$ current, and (2) N represents the amount of current in the $I_{OS2}$ current generated by current source 65 under the control of the $I_{OS1}$ current. In this case, the bandwidth of VCO 66 is $$\frac{M}{M + N}.$$

The gain of VCO 66 is also determined by the amount of $I_{OS}$ current in current source 65. For example, when $M=M_1$ and $N=N_1$, then the gain is $$\frac{M_1}{N_1 + M_1} = X$$

When $M=M_2=2M_1$ and $N=N_2$, then the gain becomes $$\frac{M_2}{M_2 + N_2} = \frac{2M_1}{M_1 + N_1} + 2X$$

In this case, the gain is doubled.

As shown in FIG. 7, the current of each of transistors 205-208 is controlled by the $I_{OS1}$ current. The current of each of transistors 201-202 is controlled by the $I_{OS}$ current. The current of each of transistors 203-204 is controlled by the output of analog multiplexer 200 that is switchable between the $I_{OS}$ and $I_{OS1}$ currents. Therefore, current source 65 is controlled to provide different current ratios of the $I_{OS}$ and $I_{OS1}$ currents in the $I_{OS2}$ current.

Analog multiplexer 200 is controlled by the SWITCH CONTROL signal to selectively couple the $I_{OS}$ and $I_{OS1}$ currents to the output of multiplexer 200. The SWITCH CONTROL signal is the indication signal generated by the system software of computer system 40 of FIG. 2 to indicate whether the peripheral device to which PLL 60 is connected is a floppy disk drive or a tape drive. For example, the SWITCH CONTROL signal is a logical high signal when a floppy disk drive is connected to PLL 60, and is a logical low signal when a tape drive is connected to PLL 60. The logical high SWITCH CONTROL signal causes analog multiplexer 200 to output the $I_{OS1}$ current at its SO input. The logical low SWITCH CONTROL signal causes analog multiplexer 200 to output the $I_{OS}$ current at its SI input.

When reference loop 68 and primary loop 69 of PLL 60 of FIG. 3 are both in the locked condition, the $I_{OS}$ and $I_{OS1}$ currents assume the substantially same current value. At this time, the current ratio of the $I_{OS}$ and $I_{OS1}$ currents in the $I_{OS2}$ current depends on the setting of current source 65. As can be seen from FIG. 7, by changing the number of transistors connected to each of $I_{OS}$ and $I_{OS1}$ currents, the ratio of the $I_{OS}$ and $I_{OS1}$ currents in the $I_{OS2}$ current is changed accordingly.

Assume each of transistors 201-208 is of the same size. The current ratio of the $I_{OS}$ and $I_{OS1}$ currents can be changed by changing the number of transistors that have their gates coupled to lines 210-212. For the embodiment shown in FIG. 7, the ratio of the $I_{OS}$ and $I_{OS1}$ currents can be 2:6 or 4:4. When three of transistors 201-208 have their gates coupled to line 210, three of transistors 201-208 have their gates coupled to line 212, and two of transistors 201-208 have their gates coupled to line 211, the ratio of the $I_{OS}$ and $I_{OS1}$ currents can be switched between 3:5 and 5:3. Different ratios can be obtained by different combinations of connection of the gates of transistors 201-208.

For example, when analog multiplexer 200 includes a first output and a second output, each being coupled to the gate of one of transistors 203-204. The SWITCH CONTROL signal controls each of the first and second outputs to receive one of the $I_{OS}$ and $I_{OS1}$ currents, respectively. In this case, three $I_{OS}$ to $I_{OS1}$ current ratios can be selected for the $I_{OS2}$ current.

When current source 65 has more transistors than transistors 203-204 having their gates connected to multiplexer 200, multiplexer 200 can also have more than two outputs coupled to these transistors for selectively coupling the $I_{OS}$ or $I_{OS1}$ current to each of the transistors. For example, when current source 65 has four transistors that have their gates coupled to four outputs of multiplexer 200, there will be five different $I_{OS}$ and $I_{OS1}$ current ratios for the $I_{OS2}$ current that current source 65 can generate.

In alternative embodiments, current source 65 has more than two transistors, each having its gate coupled to the output of multiplexer 200. In further embodiments, multiplexer 200 has more than two outputs coupled to the gates of the transistors that are associated with multiplexer 200. The number of $I_{OS}$ and $I_{OS1}$ current ratios for the $I_{OS2}$ current is equal to the number of outputs of multiplexer 200 plus one.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An adjustable current source circuit of a phase locked loop (PLL) circuitry fabricated on a single substrate for providing a first current that is a function of an error voltage proportional to an amount of a phase difference of a comparison of a reference signal and a feedback signal, comprising:

(A) a first current source coupled to receive a second current from a reference source of the PLL circuitry for providing a first portion of the first current under control of the second current, wherein the first portion of the first current is proportional to the second current;

(B) a second current source coupled to receive a third current proportional to a frequency controlled voltage of the PLL circuitry for providing a second portion of the first current under control of the third current, wherein the second portion of the first current is proportional to the third current;

(C) a third current source for providing a third portion of the first current selectively proportional to one of the second and third currents;

(D) a switching circuit coupled to receive the second and third currents for selectively controlling the third current source to couple to one of the second and third currents in order to cause the third portion of the first current proportional to a selected one of the second and third currents such that the first current can be switched to have one of a first current ratio and a second current ratio between the second and third currents and therefore the PLL circuitry can be switched between a first and a second bandwidth and loop gain.

2. The adjustable current source circuit of claim 1, wherein the first current has the first current ratio between the second and third currents when the third portion of the first current is proportional to the second current, wherein the first current has the second current ratio between the second and third currents when the third portion of the first current is proportional to the third current.

3. The adjustable current source circuit of claim 1, wherein when the first current has the first current ratio between the second and third currents, the PLL circuitry has a first bandwidth and loop gain, wherein when the first current has the second current ratio between the second and third currents, the PLL circuitry has a second bandwidth and loop gain.

4. The adjustable current source circuit of claim 1, wherein the first current source includes a first plurality of transistors, each having a gate coupled to receive a first voltage controlled by the second current, wherein the second current source includes a second plurality of transistors, each having a gate coupled to receive a second voltage controlled by the third current, wherein the third current source includes a third plurality of transistors, each having a gate coupled to an output of the switching circuit.

5. The adjustable current source circuit of claim 4, wherein the switching circuit includes a number of outputs, each for selectively coupling one of the first and second voltages associated with the second and third currents to the gate of one of the third plurality of transistors such that the adjustable current source circuit has a number of current ratios between the second and third currents that is equal to the number of outputs of the switching circuit plus one.

6. A circuitry for providing a phase locked loop fabricated on a single substrate, comprising:

(A) a phase comparator coupled to receive an input signal and a feedback signal for providing a comparison of the input signal and the feedback signal at an output;

(B) a filter circuit coupled to the phase comparator for filtering the comparison of the input signal and the feedback signal and for generating an error voltage proportional to an amount of a phase difference of the comparison of the input signal and the feedback signal;

(C) a transconductance amplifier coupled to the filter circuit for receiving the error voltage and for providing a first current that is a function of the error voltage;

(D) a reference phase locked loop coupled to receive a reference signal having a predetermined phase and a reference feedback signal for providing a second current that is a function of a reference error voltage proportional to an amount of a phase difference of a comparison of the reference signal and the reference feedback signal, wherein the second current compensates for phase of the reference feedback signal such that the reference feedback signal will have an approximately equivalent phase as the reference signal;

(E) a current source coupled to receive the first current from the transductance amplifier and the second current from the reference phase locked loop for generating a third current that is a function of the first and second currents, wherein the current source provides a selectable ratio of the first and second currents in the third current such that the circuitry for providing a phase locked loop will have an adjustable bandwidth and loop gain, wherein the current source further comprises (i) a first current source coupled to receive the second current from the reference phase locked loop for providing a first portion of the third current under control of the second current, wherein the first portion of the third current is proportional to the second current;

(ii) a second current source coupled to receive the first current from the transconductance amplifier for providing a second portion of the third current under control of the first current, wherein the second portion of the third current is proportional to the first current;

(iii) a third current source for providing a third portion of the third current selectively proportional to one of the first and second currents;

(iv) a switching circuit coupled to receive the first and second currents for selectively controlling the third current source to couple to one of the first and second currents in order to cause the third portion of the third current proportional to a selected one of the first and second currents such that the third current can be switched to have one of a first current ratio and a second current ratio between the first and second currents and therefore the circuitry can be switched between a first and a second bandwidth and loop gain;

(F) a multivibrator coupled to the current source for receiving the third current and for providing the feedback signal to the phase comparator, wherein when the error voltage changes according to the comparator, the third current changes accordingly to compensate for pulse width duration of the feedback signal such that the feedback signal will have an approximately equivalent pulse width duration as the input signal.

7. The circuitry for providing a phase locked loop of claim 6, wherein the third current has the first current ratio between the first and second currents when the third portion of the third current is proportional to the second current, wherein the third current has the second current ratio between the first and second currents when the third portion of the third current is proportional to the first current.

8. The circuitry for providing a phase locked loop of claim 6, wherein when the third current has the first current ratio between the first and second currents, the circuitry has a first bandwidth and loop gain, wherein when the third current has the second current ratio between the first and second currents, the circuitry has a second bandwidth and loop gain.

9. The circuitry for providing a phase locked loop of claim 6, wherein the first current source includes a first plurality of transistors, each having a gate coupled to receive a first voltage controlled by the second current, wherein the second current source includes a second plurality of transistors, each having a gate coupled to receive a second voltage controlled by the first current, wherein the third current source includes a third plurality of transistors, each having a gate coupled to an output of the switching circuit.

10. The circuitry for providing a phase locked loop of claim 9, wherein the switching circuit includes a number of outputs, each for selectively coupling one of the first and second currents to the gate of one of the third plurality of transistors such that the current source circuit has a number of current ratios between the first and second currents that is equal to the number of outputs of the switching circuit plus one.

11. A computer system, comprising:
(A) a system bus;
(B) a central processing unit (CPU) coupled to the system bus;
(C) a memory coupled to the system bus;
(D) a plurality of peripheral controllers, each of which being coupled to the system bus, wherein one of the plurality of peripheral controllers includes a phase locked loop circuit, wherein the phase locked loop circuit further comprises
 (i) a phase comparator coupled to receive an input signal and a feedback signal for providing a comparison of the input signal and the feedback signal at an output;
 (ii) a filter circuit coupled to the phase comparator for filtering the comparison of the input signal and the feedback signal and for generating an error voltage proportional to an amount of a phase difference of the comparison of the input signal and the feedback signal;
 (iii) a transconductance amplifier coupled to the filter circuit for receiving the error voltage and for providing a first current that is a function of the error voltage;
 (iv) a reference phase locked loop coupled to receive a reference signal having a predetermined phase and a reference feedback signal for providing a second current that is a function of a reference error voltage proportional to an amount of a phase difference of a comparison of the reference signal and the reference feedback signal, wherein the second current compensates for phase of the reference feedback signal such that the reference feedback signal will have an approximately equivalent phase as the reference signal;
 (v) a current source coupled to receive the first current from the transconductance amplifier and the second current from the reference phase locked loop for generating a third current that is a function of the first and second currents, wherein the current source provides a selectable ratio of the first and second currents in the third current such that the phase locked loop circuit will have an adjustable bandwidth and loop gain, wherein the current source further comprises
  (1) a first current source coupled to receive the second current from the reference phase locked loop for providing a first portion of the third current under control of the second current, wherein the first portion of the third current is proportional to the second current;
  (2) a second current source coupled to receive the first current from the transconductance amplifier for providing a second portion of the third current under control of the first current, wherein the second portion of the third current is proportional to the first current;
  (3) a third current source for providing a third position of the third current selectively proportional to one of the first and second currents;
  (4) a switching circuit coupled to receive the first and second currents for selectively controlling the third current source to couple to one of the first and second currents in order to cause the third portion of the third current proportional to a selected one of the first and second currents such that the third current can be switched to have one of a first current ratio and a second current ratio between the first and second currents and therefore the phase locked loop circuit can be switched between a first and a second bandwidth and loop gain;
 (vi) a multivibrator coupled to the current source for receiving the third current and for providing the feedback signal to the phase comparator, wherein when the error voltage changes according to the comparison, the third current changes accordingly to compensate for phase of the feedback signal such that the feedback signal will have an approximately equivalent phase as the input signal.

12. The computer system of claim 11, wherein the third current has the first current ratio between the first and second currents when the third portion of the third current is proportional to the second current, wherein the third current has the second current ratio between the first and second currents when the third portion of the third current is proportional to the first current.

13. The computer system of claim 11, wherein when the third current has the first current ratio between the first and second currents, the circuitry has a first bandwidth and loop gain, wherein when the third current has the second current ratio between the first and second currents, the circuitry has a second bandwidth and loop gain.

14. The computer system of claim 11, wherein the first current source includes a first plurality of transistors, each having a gate coupled to receive a first voltage controlled by the second current, wherein the second current source includes a second plurality of transistors, each having a gate coupled to receive a second voltage controlled by the first current, wherein the third current source includes a third plurality of transistors, each having a gate coupled to an output of the switching circuit.

15. The computer system of claim 14, wherein the switching circuit includes a number of outputs, each for selectively coupling one of the first and second currents to the gate of one of the third plurality of transistors such that the current source circuit has a number of current ratios between the first and second currents that is equal to the number of outputs of the switching circuit plus one.

* * * * *

UNITED STATES PATENT AND TRADEMARK OFFICE
CERTIFICATE OF CORRECTION

PATENT NO. : 5,332,930
DATED : July 26, 1994
INVENTOR(S) : Andrew M. Volk

It is certified that error appears in the above-indentified patent and that said Letters Patent is hereby corrected as shown below:

Col. 3, Line 64            Delete "change" insert --charge--

Col. 11, Line 52          Delete "pasasitic" insert --parasitic--

Col. 13, Between Lines 40 and 45    Delete "+2X" insert --=2X--

Signed and Sealed this

Twenty-seventh Day of June, 1995

Attest:

BRUCE LEHMAN

Attesting Officer          Commissioner of Patents and Trademarks